United States Patent
Center (10) Patent No.: US 8,204,702 B2
(45) Date of Patent: Jun. 19, 2012

(54) METHOD FOR ESTIMATING BATTERY LIFE IN A HYBRID POWERTRAIN

(75) Inventor: Marc B. Center, Royal Oak, MI (US)

(73) Assignees: GM Global Technology Operations LLC, Detroit, MI (US); Daimler AG, Stuttgart (DE); Chrysler Group LLC, Auburn Hills, MI (US); Bayerische Motoren Werke Aktiengesellschaft, Munich (DE)

( * ) Notice: Subject to any disclaimer, the term of this patent is extended or adjusted under 35 U.S.C. 154(b) by 400 days.

(21) Appl. No.: 12/212,886

(22) Filed: Sep. 18, 2008

(65) Prior Publication Data

US 2009/0112495 A1    Apr. 30, 2009

Related U.S. Application Data

(60) Provisional application No. 60/982,830, filed on Oct. 26, 2007.

(51) Int. Cl.
*G01R 31/36* (2006.01)

(52) U.S. Cl. .......... 702/63; 320/106; 320/118; 320/130; 320/132; 320/136; 324/428; 324/430

(58) Field of Classification Search ............... 702/63
See application file for complete search history.

(56) References Cited

U.S. PATENT DOCUMENTS

| | | | |
|---|---|---|---|
| 5,321,627 A * | 6/1994 | Reher | 702/63 |
| 6,832,148 B1 | 12/2004 | Bennett | |
| 6,868,318 B1 | 3/2005 | Cawthorne | |
| 6,897,773 B2 * | 5/2005 | Ridley | 340/506 |
| 7,154,236 B1 | 12/2006 | Heap | |
| 2003/0106541 A1 * | 6/2003 | Dixon et al. | 123/565 |
| 2004/0008031 A1 * | 1/2004 | Arai et al. | 324/429 |
| 2005/0076958 A1 | 4/2005 | Foster | |
| 2005/0077867 A1 | 4/2005 | Cawthorne | |
| 2005/0077877 A1 | 4/2005 | Cawthorne | |
| 2005/0080523 A1 | 4/2005 | Bennett | |
| 2005/0080527 A1 | 4/2005 | Tao | |
| 2005/0080535 A1 | 4/2005 | Steinmetz | |
| 2005/0080537 A1 | 4/2005 | Cawthorne | |
| 2005/0080538 A1 | 4/2005 | Hubbard | |
| 2005/0080539 A1 | 4/2005 | Hubbard | |
| 2005/0080540 A1 | 4/2005 | Steinmetz | |
| 2005/0080541 A1 | 4/2005 | Sah | |
| 2005/0182526 A1 | 8/2005 | Hubbard | |
| 2005/0182543 A1 | 8/2005 | Sah | |
| 2005/0182546 A1 | 8/2005 | Hsieh | |
| 2005/0182547 A1 | 8/2005 | Sah | |
| 2005/0189918 A1 | 9/2005 | Weisgerber | |
| 2005/0252283 A1 | 11/2005 | Heap | |
| 2005/0252305 A1 | 11/2005 | Hubbard | |
| 2005/0252474 A1 | 11/2005 | Sah | |
| 2005/0255963 A1 | 11/2005 | Hsieh | |
| 2005/0255964 A1 | 11/2005 | Heap | |
| 2005/0255965 A1 | 11/2005 | Tao | |
| 2005/0255966 A1 | 11/2005 | Tao | |
| 2005/0255967 A1 | 11/2005 | Foster | |

(Continued)

*Primary Examiner* — Andrew Schechter
*Assistant Examiner* — Haidong Zhang (57) ABSTRACT

A method for estimating an operating life for an electrical energy storage system electrically connected to transmit power to a hybrid powertrain system includes monitoring temperature state-of-charge and electric current of the electrical energy storage system, calculating a battery life metric for a time interval based upon the temperature, the state-of-charge, and the electric current discharge, determining a total battery life metric therefrom and determining the remaining operating life of the electrical energy storage system.

13 Claims, 4 Drawing Sheets

U.S. PATENT DOCUMENTS

| | | |
|---|---|---|
| 2005/0255968 A1 | 11/2005 | Sah |
| 2005/0256617 A1 | 11/2005 | Cawthorne |
| 2005/0256618 A1 | 11/2005 | Hsieh |
| 2005/0256623 A1 | 11/2005 | Hubbard |
| 2005/0256625 A1 | 11/2005 | Sah |
| 2005/0256626 A1 | 11/2005 | Hsieh |
| 2005/0256627 A1 | 11/2005 | Sah |
| 2005/0256629 A1 | 11/2005 | Tao |
| 2005/0256631 A1 | 11/2005 | Cawthorne |
| 2005/0256633 A1 | 11/2005 | Heap |
| 2005/0256919 A1 | 11/2005 | Cawthorne |
| 2006/0176024 A1* | 8/2006 | Zettel et al. .................. 320/132 |
| 2006/0194670 A1 | 8/2006 | Heap |
| 2007/0029974 A1* | 2/2007 | Uchida ........................ 320/132 |
| 2007/0078580 A1 | 4/2007 | Cawthorne |
| 2007/0093953 A1 | 4/2007 | Heap |
| 2007/0149348 A1 | 6/2007 | Holmes |
| 2007/0191181 A1 | 8/2007 | Burns |
| 2007/0225886 A1 | 9/2007 | Morris |
| 2007/0225887 A1 | 9/2007 | Morris |
| 2007/0225888 A1 | 9/2007 | Morris |
| 2007/0225889 A1 | 9/2007 | Morris |
| 2007/0260381 A1 | 11/2007 | Sah |
| 2007/0276569 A1 | 11/2007 | Sah |
| 2007/0284162 A1 | 12/2007 | Zettel |
| 2007/0284163 A1 | 12/2007 | Heap |
| 2007/0284176 A1 | 12/2007 | Sah |
| 2007/0285059 A1 | 12/2007 | Zettel |
| 2007/0285060 A1* | 12/2007 | Zettel et al. .................. 320/132 |
| 2007/0285061 A1 | 12/2007 | Zettel |
| 2007/0285063 A1 | 12/2007 | Zettel |
| 2007/0285097 A1 | 12/2007 | Zettel |
| 2008/0004779 A1 | 1/2008 | Sah |
| 2008/0028879 A1 | 2/2008 | Robinette |
| 2008/0032855 A1 | 2/2008 | Sah |
| 2008/0064559 A1 | 3/2008 | Cawthorne |
| 2008/0064562 A1 | 3/2008 | Zettel |
| 2008/0103003 A1 | 5/2008 | Sah |
| 2008/0119320 A1 | 5/2008 | Wu |
| 2008/0119321 A1 | 5/2008 | Heap |
| 2008/0120000 A1 | 5/2008 | Heap |
| 2008/0120001 A1 | 5/2008 | Heap |
| 2008/0120002 A1 | 5/2008 | Heap |
| 2008/0176706 A1 | 7/2008 | Wu |
| 2008/0176709 A1 | 7/2008 | Wu |
| 2008/0181280 A1 | 7/2008 | Wang |
| 2008/0182696 A1 | 7/2008 | Sah |
| 2008/0183372 A1 | 7/2008 | Snyder |
| 2008/0234097 A1 | 9/2008 | Sah |
| 2008/0236921 A1 | 10/2008 | Huseman |
| 2008/0243346 A1 | 10/2008 | Huseman |
| 2008/0249745 A1 | 10/2008 | Heap |
| 2008/0262694 A1 | 10/2008 | Heap |
| 2008/0262698 A1 | 10/2008 | Lahti |
| 2008/0272717 A1 | 11/2008 | Gleason |
| 2008/0275611 A1 | 11/2008 | Snyder |
| 2008/0275624 A1 | 11/2008 | Snyder |
| 2008/0275625 A1 | 11/2008 | Snyder |
| 2008/0287255 A1 | 11/2008 | Snyder |
| 2009/0069148 A1 | 3/2009 | Heap |
| 2009/0069989 A1 | 3/2009 | Heap |
| 2009/0070019 A1 | 3/2009 | Heap |
| 2009/0082170 A1 | 3/2009 | Heap |
| 2009/0088294 A1 | 4/2009 | West |
| 2009/0105039 A1 | 4/2009 | Sah |
| 2009/0105896 A1 | 4/2009 | Tamai |
| 2009/0105898 A1 | 4/2009 | Wu |
| 2009/0105914 A1 | 4/2009 | Buur |
| 2009/0107745 A1 | 4/2009 | Buur |
| 2009/0107755 A1 | 4/2009 | Kothari |
| 2009/0108673 A1 | 4/2009 | Wang |
| 2009/0111637 A1 | 4/2009 | Day |
| 2009/0111640 A1 | 4/2009 | Buur |
| 2009/0111642 A1 | 4/2009 | Sah |
| 2009/0111643 A1 | 4/2009 | Sah |
| 2009/0111644 A1 | 4/2009 | Kaminsky |
| 2009/0111645 A1 | 4/2009 | Heap |
| 2009/0112385 A1 | 4/2009 | Heap |
| 2009/0112392 A1 | 4/2009 | Buur |
| 2009/0112399 A1 | 4/2009 | Buur |
| 2009/0112412 A1 | 4/2009 | Cawthorne |
| 2009/0112416 A1 | 4/2009 | Heap |
| 2009/0112417 A1 | 4/2009 | Kaminsky |
| 2009/0112418 A1 | 4/2009 | Buur |
| 2009/0112419 A1 | 4/2009 | Heap |
| 2009/0112420 A1 | 4/2009 | Buur |
| 2009/0112421 A1 | 4/2009 | Sah |
| 2009/0112422 A1 | 4/2009 | Sah |
| 2009/0112423 A1 | 4/2009 | Foster |
| 2009/0112427 A1 | 4/2009 | Heap |
| 2009/0112428 A1 | 4/2009 | Sah |
| 2009/0112429 A1 | 4/2009 | Sah |
| 2009/0115349 A1 | 5/2009 | Heap |
| 2009/0115350 A1 | 5/2009 | Heap |
| 2009/0115351 A1 | 5/2009 | Heap |
| 2009/0115352 A1 | 5/2009 | Heap |
| 2009/0115353 A1 | 5/2009 | Heap |
| 2009/0115354 A1 | 5/2009 | Heap |
| 2009/0115365 A1 | 5/2009 | Heap |
| 2009/0115373 A1 | 5/2009 | Kokotovich |
| 2009/0115377 A1 | 5/2009 | Schwenke |
| 2009/0115408 A1 | 5/2009 | West |
| 2009/0115491 A1 | 5/2009 | Anwar |
| 2009/0118074 A1 | 5/2009 | Zettel |
| 2009/0118075 A1 | 5/2009 | Heap |
| 2009/0118076 A1 | 5/2009 | Heap |
| 2009/0118077 A1 | 5/2009 | Hsieh |
| 2009/0118078 A1 | 5/2009 | Wilmanowicz |
| 2009/0118079 A1 | 5/2009 | Heap |
| 2009/0118080 A1 | 5/2009 | Heap |
| 2009/0118081 A1 | 5/2009 | Heap |
| 2009/0118082 A1 | 5/2009 | Heap |
| 2009/0118083 A1 | 5/2009 | Kaminsky |
| 2009/0118084 A1 | 5/2009 | Heap |
| 2009/0118085 A1 | 5/2009 | Heap |
| 2009/0118086 A1 | 5/2009 | Heap |
| 2009/0118087 A1 | 5/2009 | Hsieh |
| 2009/0118089 A1 | 5/2009 | Heap |
| 2009/0118090 A1 | 5/2009 | Heap |
| 2009/0118091 A1 | 5/2009 | Lahti |
| 2009/0118093 A1 | 5/2009 | Heap |
| 2009/0118094 A1 | 5/2009 | Hsieh |
| 2009/0118877 A1 | 5/2009 | Center |
| 2009/0118879 A1 | 5/2009 | Heap |
| 2009/0118880 A1 | 5/2009 | Heap |
| 2009/0118882 A1 | 5/2009 | Heap |
| 2009/0118883 A1 | 5/2009 | Heap |
| 2009/0118884 A1 | 5/2009 | Heap |
| 2009/0118885 A1 | 5/2009 | Heap |
| 2009/0118886 A1 | 5/2009 | Tamai |
| 2009/0118887 A1 | 5/2009 | Minarcin |
| 2009/0118888 A1 | 5/2009 | Minarcin |
| 2009/0118901 A1 | 5/2009 | Cawthorne |
| 2009/0118914 A1 | 5/2009 | Schwenke |
| 2009/0118915 A1 | 5/2009 | Heap |
| 2009/0118916 A1 | 5/2009 | Kothari |
| 2009/0118917 A1 | 5/2009 | Sah |
| 2009/0118918 A1 | 5/2009 | Heap |
| 2009/0118919 A1 | 5/2009 | Heap |
| 2009/0118920 A1 | 5/2009 | Heap |
| 2009/0118921 A1 | 5/2009 | Heap |
| 2009/0118922 A1 | 5/2009 | Heap |
| 2009/0118923 A1 | 5/2009 | Heap |
| 2009/0118924 A1 | 5/2009 | Hsieh |
| 2009/0118925 A1 | 5/2009 | Hsieh |
| 2009/0118926 A1 | 5/2009 | Heap |
| 2009/0118927 A1 | 5/2009 | Heap |
| 2009/0118928 A1 | 5/2009 | Heap |
| 2009/0118929 A1 | 5/2009 | Heap |
| 2009/0118930 A1 | 5/2009 | Heap |
| 2009/0118931 A1 | 5/2009 | Kaminsky |
| 2009/0118932 A1 | 5/2009 | Heap |
| 2009/0118933 A1 | 5/2009 | Heap |
| 2009/0118934 A1 | 5/2009 | Heap |
| 2009/0118935 A1 | 5/2009 | Heap |
| 2009/0118936 A1 | 5/2009 | Heap |
| 2009/0118937 A1 | 5/2009 | Heap |

| | | | | | | |
|---|---|---|---|---|---|---|
| 2009/0118938 A1 | 5/2009 | Heap | | 2009/0118951 A1 | 5/2009 | Heap |
| 2009/0118939 A1 | 5/2009 | Heap | | 2009/0118952 A1 | 5/2009 | Heap |
| 2009/0118940 A1 | 5/2009 | Heap | | 2009/0118954 A1 | 5/2009 | Wu |
| 2009/0118941 A1 | 5/2009 | Heap | | 2009/0118957 A1 | 5/2009 | Heap |
| 2009/0118942 A1 | 5/2009 | Hsieh | | 2009/0118962 A1 | 5/2009 | Heap |
| 2009/0118943 A1 | 5/2009 | Heap | | 2009/0118963 A1 | 5/2009 | Heap |
| 2009/0118944 A1 | 5/2009 | Heap | | 2009/0118964 A1 | 5/2009 | Snyder |
| 2009/0118945 A1 | 5/2009 | Heap | | 2009/0118969 A1 | 5/2009 | Heap |
| 2009/0118946 A1 | 5/2009 | Heap | | 2009/0118971 A1 | 5/2009 | Heap |
| 2009/0118947 A1 | 5/2009 | Heap | | 2009/0118999 A1 | 5/2009 | Heap |
| 2009/0118948 A1 | 5/2009 | Heap | | 2009/0144002 A1 | 6/2009 | Zettel |
| 2009/0118949 A1 | 5/2009 | Heap | | | | |
| 2009/0118950 A1 | 5/2009 | Heap | | | | |

* cited by examiner

METHOD FOR ESTIMATING BATTERY LIFE IN A HYBRID POWERTRAIN

CROSS REFERENCE TO RELATED APPLICATIONS

This application claims the benefit of U.S. Provisional Application No. 60/982,830 filed on Oct. 26, 2007 which is hereby incorporated herein by reference.

TECHNICAL FIELD

This disclosure pertains to control systems for electromechanical transmissions.

BACKGROUND

The statements in this section merely provide background information related to the present disclosure and may not constitute prior art.

Known powertrain architectures include torque-generative devices, including internal combustion engines and electric machines, which transmit torque through a transmission device to an output member. One exemplary powertrain includes a two-mode, compound-split, electromechanical transmission which utilizes an input member for receiving motive torque from a prime mover power source, preferably an internal combustion engine, and an output member. The output member can be operatively connected to a driveline for a motor vehicle for transmitting tractive torque thereto. Electric machines, operative as motors or generators, generate a torque input to the transmission independently of a torque input from the internal combustion engine. The electric machines may transform vehicle kinetic energy, transmitted through the vehicle driveline, to electrical energy that is storable in an electrical energy storage device. A control system monitors various inputs from the vehicle and the operator and provides operational control of the powertrain, including controlling transmission operating range state and gear shifting, controlling the torque-generative devices, and regulating the electrical power interchange among the electrical energy storage device and the electric machines to manage outputs of the transmission, including torque and rotational speed. Fuel efficiency on hybrid powertrains can depend on operation of electrical storage devices.

SUMMARY

A hybrid powertrain system includes an electromechanical transmission operatively coupled to an internal combustion engine and an electric machine connected to an electrical energy storage device to transmit mechanical power to an output member. A method for estimating an operating life of the electrical energy storage device includes monitoring temperature, state-of-charge and electric current of the electrical energy storage device. A temperature factor and a state-of-charge factor based, respectively, upon the monitored temperature and monitored state-of-charge during a predetermined time interval are determined. A battery life metric during the predetermined time interval is determined based upon the temperature factor, the state-of-charge factor, and the electric current discharge, and a total battery life metric based on the calculated battery life metric. The remaining operating life of the electrical energy storage device is determined based upon the total battery life metric.

BRIEF DESCRIPTION OF THE DRAWINGS

One or more embodiments will now be described, by way of example, with reference to the accompanying drawings, in which.

DETAILED DESCRIPTION

Figure 1:
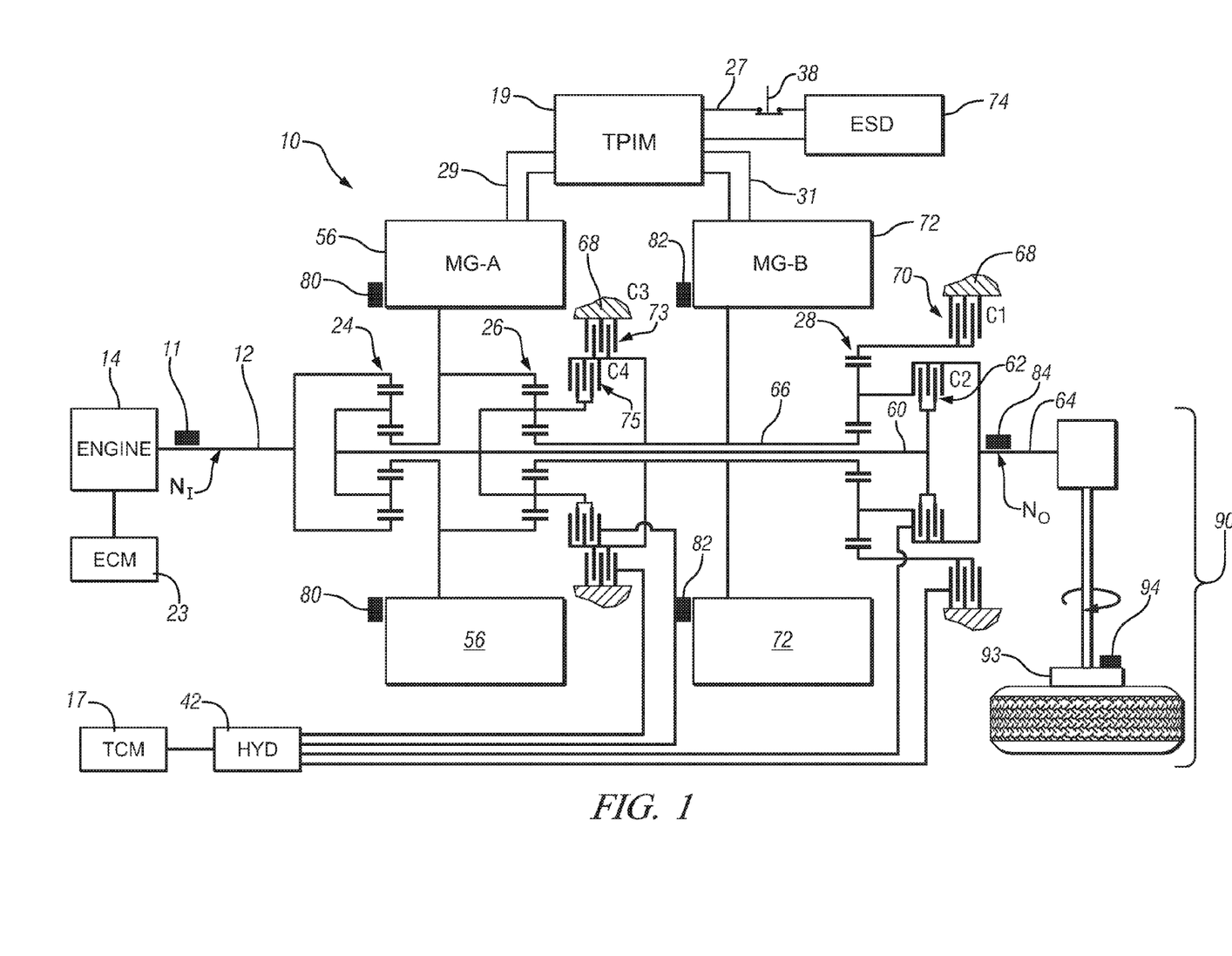
FIG. 1 is a schematic diagram of an exemplary powertrain, in accordance with the present disclosure.
Figure 2:
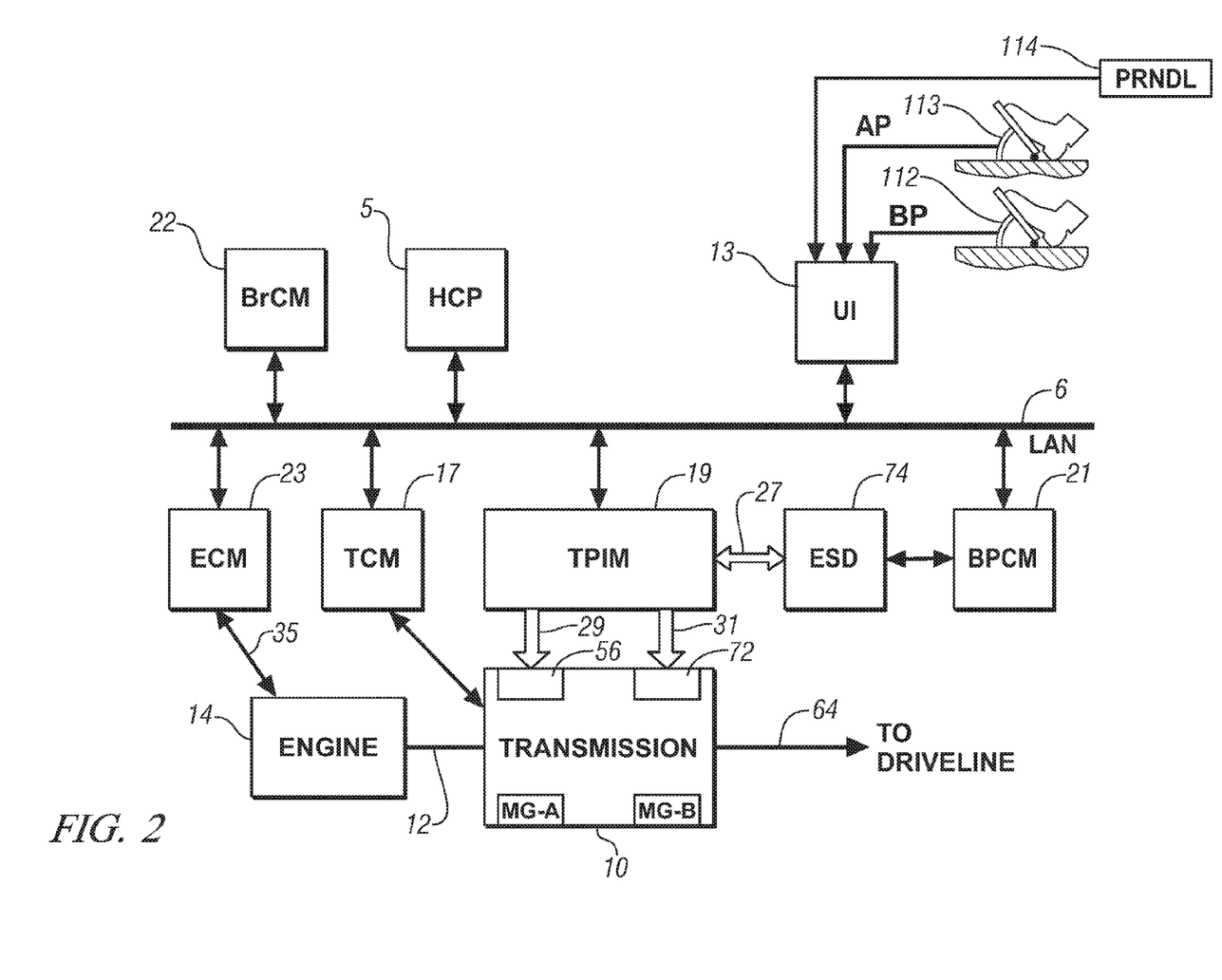
FIG. 2 is a schematic diagram of an exemplary architecture for a control system and powertrain, in accordance with the present disclosure.

Referring now to the drawings, wherein the showings are for the purpose of illustrating certain exemplary embodiments only and not for the purpose of limiting the same, FIGS. 1 and 2 depict an exemplary electromechanical hybrid powertrain. The exemplary electromechanical hybrid powertrain in accordance with the present disclosure is depicted in FIG. 1, comprising a two-mode, compound-split, electromechanical hybrid transmission 10 operatively connected to an engine 14 and first and second electric machines ('MG-A') 56 and ('MG-B') 72. The engine 14 and first and second electric machines 56 and 72 each generate power which can be transferred to the transmission 10. The power generated by the engine 14 and the first and second electric machines 56 and 72 and transferred to the transmission 10 is described in terms of input and motor torques, referred to herein as $T_I$, and $T_A$ and $T_B$ respectively, and speed, referred to herein as $N_I$, and $N_A$ and $N_B$, respectively.

The exemplary engine 14 comprises a multi-cylinder internal combustion engine selectively operative in several states to transfer torque to the transmission 10 via an input shaft 12, and can be either a spark-ignition or a compression-ignition engine. The engine 14 includes a crankshaft (not shown) operatively coupled to the input shaft 12 of the transmission 10. A rotational speed sensor 11 monitors rotational speed of the input shaft 12. Power output from the engine 14, comprising rotational speed and engine torque, can differ from the input speed $N_I$ and the input torque $T_I$ to the transmission 10 due to placement of torque-consuming components on the input shaft 12 between the engine 14 and the transmission 10, e.g., a hydraulic pump (not shown) and/or a torque management device (not shown).

The exemplary transmission 10 comprises three planetary-gear sets 24, 26 and 28, and four selectively engageable torque-transferring devices, i.e., clutches C1 70, C2 62, C3 73, and C4 75. As used herein, clutches refer to any type of friction torque transfer device including single or compound plate clutches or packs, band clutches, and brakes, for example. A hydraulic control circuit 42, preferably controlled by a transmission control module (hereafter 'TCM') 17, is operative to control clutch states. Clutches C2 62 and C4 75 preferably comprise hydraulically-applied rotating friction clutches. Clutches C1 70 and C3 73 preferably comprise hydraulically-controlled stationary devices that can be selectively grounded to a transmission case 68. Each of the clutches C1 70, C2 62, C3 73, and C4 75 is preferably hydraulically applied, selectively receiving pressurized hydraulic fluid via the hydraulic control circuit 42.

The first and second electric machines 56 and 72 preferably comprise three-phase AC machines, each including a stator (not shown) and a rotor (not shown), and respective resolvers 80 and 82. The motor stator for each machine is grounded to an outer portion of the transmission case 68, and includes a stator core with coiled electrical windings extending therefrom. The rotor for the first electric machine 56 is supported on a hub plate gear that is operatively attached to shaft 60 via the second planetary gear set 26. The rotor for the second electric machine 72 is fixedly attached to a sleeve shaft hub 66.

Each of the resolvers 80 and 82 preferably comprises a variable reluctance device including a resolver stator (not shown) and a resolver rotor (not shown). The resolvers 80 and 82 are appropriately positioned and assembled on respective ones of the first and second electric machines 56 and 72. Stators of respective ones of the resolvers 80 and 82 are operatively connected to one of the stators for the first and second electric machines 56 and 72. The resolver rotors are operatively connected to the rotor for the corresponding first and second electric machines 56 and 72. Each of the resolvers 80 and 82 is signally and operatively connected to a transmission power inverter control module (hereafter 'TPIM') 19, and each senses and monitors rotational position of the resolver rotor relative to the resolver stator, thus monitoring rotational position of respective ones of first and second electric machines 56 and 72. Additionally, the signals output from the resolvers 80 and 82 are interpreted to provide the rotational speeds for first and second electric machines 56 and 72, i.e., $N_A$ and $N_B$, respectively.

The transmission 10 includes an output member 64, e.g. a shaft, which is operably connected to a driveline 90 for a vehicle (not shown), to provide output power to the driveline 90 that is transferred to vehicle wheels 93, one of which is shown in FIG. 1. The output power at the output member 64 is characterized in terms of an output rotational speed $N_O$ and an output torque $T_O$. A transmission output speed sensor 84 monitors rotational speed and rotational direction of the output member 64. Each of the vehicle wheels 93 is preferably equipped with a sensor 94 adapted to monitor wheel speed, $V_{SS-WHL}$, the output of which is monitored by a control module of a distributed control module system described with respect to FIG. 2, to determine vehicle speed, and absolute and relative wheel speeds for braking control, traction control, and vehicle acceleration management.

The input torque from the engine 14 and the motor torques from the first and second electric machines 56 and 72 ($T_I$, $T_A$, and $T_B$ respectively) are generated as a result of energy conversion from fuel or electrical potential stored in an electrical energy storage device (hereafter 'ESD') 74. The ESD 74 is high voltage DC-coupled to the TPIM 19 via DC transfer conductors 27. The transfer conductors 27 include a contactor switch 38. When the contactor switch 38 is closed, under normal operation, electric current can flow between the ESD 74 and the TPIM 19. When the contactor switch 38 is opened electric current flow between the ESD 74 and the TPIM 19 is interrupted. The TPIM 19 transmits electrical power to and from the first electric machine 56 by transfer conductors 29, and the TPIM 19 similarly transmits electrical power to and from the second electric machine 72 by transfer conductors 31 to meet the torque commands for the first and second electric machines 56 and 72 in response to the motor torques $T_A$ and $T_B$. Electrical current is transmitted to and from the ESD 74 in accordance with whether the ESD 74 is being charged or discharged.

The TPIM 19 includes the pair of power inverters (not shown) and respective motor control modules (not shown) configured to receive the torque commands and control inverter states therefrom for providing motor drive or regeneration functionality to meet the commanded motor torques $T_A$ and $T_B$. The power inverters comprise known complementary three-phase power electronics devices, and each includes a plurality of insulated gate bipolar transistors (not shown) for converting DC power from the ESD 74 to AC power for powering respective ones of the first and second electric machines 56 and 72, by switching at high frequencies. The insulated gate bipolar transistors form a switch mode power supply configured to receive control commands. There is typically one pair of insulated gate bipolar transistors for each phase of each of the three-phase electric machines. States of the insulated gate bipolar transistors are controlled to provide motor drive mechanical power generation or electric power regeneration functionality. The three-phase inverters receive or supply DC electric power via DC transfer conductors 27 and transform it to or from three-phase AC power, which is conducted to or from the first and second electric machines 56 and 72 for operation as motors or generators via transfer conductors 29 and 31 respectively.

FIG. 2 is a schematic block diagram of the distributed control module system. The elements described hereinafter comprise a subset of an overall vehicle control architecture, and provide coordinated system control of the exemplary hybrid powertrain described in FIG. 1. The distributed control module system synthesizes pertinent information and inputs, and executes algorithms to control various actuators to meet control objectives, including objectives related to fuel economy, emissions, performance, drivability, and protection of hardware, including batteries of ESD 74 and the first and second electric machines 56 and 72. The distributed control module system includes an engine control module (hereafter 'ECM') 23, the TCM 17, a battery pack control module (hereafter 'BPCM') 21, and the TPIM 19. A hybrid control module (hereafter 'HCP') 5 provides supervisory control and coordination of the ECM 23, the TCM 17, the BPCM 21, and the TPIM 19. A user interface ('UI') 13 is operatively connected to a plurality of devices through which a vehicle operator controls or directs operation of the electromechanical hybrid powertrain. The devices include an accelerator pedal 113 ('AP'), an operator brake pedal 112 ('BP'), a transmission gear selector 114 ('PRNDL'), and a vehicle speed cruise control (not shown). The transmission gear selector 114 may have a discrete number of operator-selectable positions, including the rotational direction of the output member 64 to enable one of a forward and a reverse direction.

The aforementioned control modules communicate with other control modules, sensors, and actuators via a local area network (hereafter 'LAN') bus 6. The LAN bus 6 allows for structured communication of states of operating parameters and actuator command signals between the various control modules. The specific communication protocol utilized is application-specific. The LAN bus 6 and appropriate protocols provide for robust messaging and multi-control module interfacing between the aforementioned control modules, and other control modules providing functionality including e.g., antilock braking, traction control, and vehicle stability. Multiple communications buses may be used to improve communications speed and provide some level of signal redundancy and integrity. Communication between individual control modules can also be effected using a direct link, e.g., a serial peripheral interface ('SPI') bus (not shown).

The HCP 5 provides supervisory control of the hybrid powertrain, serving to coordinate operation of the ECM 23, TCM 17, TPIM 19, and BPCM 21. Based upon various input signals from the user interface 13 and the hybrid powertrain, including the ESD 74, the HCP 5 determines an operator torque request, an output torque command, an engine input torque command, clutch torque(s) for the applied torque-transfer clutches C1 70, C2 62, C3 73, C4 75 of the transmission 10, and the motor torques $T_A$ and $T_B$ for the first and second electric machines 56 and 72. The TCM 17 is operatively connected to the hydraulic control circuit 42 and provides various functions including monitoring various pressure sensing devices (not shown) and generating and communicating control signals to various solenoids (not shown) thereby controlling pressure switches and control valves contained within the hydraulic control circuit 42.

The ECM 23 is operatively connected to the engine 14, and functions to acquire data from sensors and control actuators of the engine 14 over a plurality of discrete lines, shown for simplicity as an aggregate bidirectional interface cable 35. The ECM 23 receives the engine input torque command from the HCP 5. The ECM 23 determines the actual engine input torque, $T_I$, provided to the transmission 10 at that point in time based upon monitored engine speed and load, which is communicated to the HCP 5. The ECM 23 monitors input from the rotational speed sensor 11 to determine the engine input speed to the input shaft 12, which translates to the transmission input speed, $N_I$. The ECM 23 monitors inputs from sensors (not shown) to determine states of other engine operating parameters including, e.g., a manifold pressure, engine coolant temperature, ambient air temperature, and ambient pressure. The engine load can be determined, for example, from the manifold pressure, or alternatively, from monitoring operator input to the accelerator pedal 113. The ECM 23 generates and communicates command signals to control engine actuators, including, e.g., fuel injectors, ignition modules, and throttle control modules, none of which are shown.

The TCM 17 is operatively connected to the transmission 10 and monitors inputs from sensors (not shown) to determine states of transmission operating parameters. The TCM 17 generates and communicates command signals to control the transmission 10, including controlling the hydraulic circuit 42. Inputs from the TCM 17 to the HCP 5 include estimated clutch torques for each of the clutches, i.e., C1 70, C2 62, C3 73, and C4 75, and rotational output speed, $N_O$, of the output member 64. Other actuators and sensors may be used to provide additional information from the TCM 17 to the HCP 5 for control purposes. The TCM 17 monitors inputs from pressure switches (not shown) and selectively actuates pressure control solenoids (not shown) and shift solenoids (not shown) of the hydraulic circuit 42 to selectively actuate the various clutches C1 70, C2 62, C3 73, and C4 75 to achieve various transmission operating range states, as described hereinbelow.

The BPCM 21 is signally connected to sensors (not shown) to monitor the ESD 74, including monitoring electrical current and voltage parameters, to provide information indicative of parametric states of the batteries of the ESD 74 to the HCP 5. The parametric states of the batteries preferably include battery state-of-charge, battery voltage, battery temperature, and available battery power, referred to as a range $P_{BAT\_MIN}$ to $P_{BAT\_MAX}$.

A brake control module (hereafter 'BrCM') (not shown) is operatively connected to friction brakes (not shown) on each of the vehicle wheels 93. The BrCM monitors the operator input to the brake pedal 112 and generates control signals to control the friction brakes and sends a control signal to the HCP 5 to operate the first and second electric machines 56 and 72 based thereon.

Each of the control modules ECM 23, TCM 17, TPIM 19, BPCM 21, and BrCM is preferably a general-purpose digital computer comprising a microprocessor or central processing unit, storage mediums comprising read only memory ('ROM'), random access memory ('RAM'), electrically programmable read only memory ('EPROM'), a high speed clock, analog to digital ('A/D') and digital to analog ('D/A') circuitry, and input/output circuitry and devices ('I/O') and appropriate signal conditioning and buffer circuitry. Each of the control modules has a set of control algorithms, comprising resident program instructions and calibrations stored in one of the storage mediums and executed to provide the respective functions of each computer. Information transfer between the control modules is preferably accomplished using the LAN bus 6 and serial peripheral interface buses. The control algorithms are executed during preset loop cycles such that each algorithm is executed at least once each loop cycle. Algorithms stored in the non-volatile memory devices are executed by one of the central processing units to monitor inputs from the sensing devices and execute control and diagnostic routines to control operation of the actuators, using preset calibrations. Loop cycles are executed at regular intervals, for example each 3.125, 6.25, 12.5, 25 and 100 milliseconds during ongoing operation of the hybrid powertrain. Alternatively, algorithms may be executed in response to the occurrence of an event.

The exemplary hybrid powertrain selectively operates in one of several operating range states that can be described in terms of an engine state comprising one of an engine-on state ('ON') and an engine-off state ('OFF'), and a transmission state comprising a plurality of fixed gears and continuously variable operating modes, described with reference to Table 1, below.

TABLE 1

| Description | Engine State | Transmission Operating Range State | Applied Clutches | |
|---|---|---|---|---|
| M1_Eng_Off | OFF | EVT Mode 1 | C1 70 | |
| M1_Eng_On | ON | EVT Mode 1 | C1 70 | |
| G1 | ON | Fixed Gear Ratio 1 | C1 70 | C4 75 |
| G2 | ON | Fixed Gear Ratio 2 | C1 70 | C2 62 |
| M2_Eng_Off | OFF | EVT Mode 2 | C2 62 | |
| M2_Eng_On | ON | EVT Mode 2 | C2 62 | |
| G3 | ON | Fixed Gear Ratio 3 | C2 62 | C4 75 |
| G4 | ON | Fixed Gear Ratio 4 | C2 62 | C3 73 |

Each of the transmission operating range states is described in the table and indicates which of the specific clutches C1 70, C2 62, C3 73, and C4 75 are applied for each of the operating range states. A first continuously variable mode, i.e., EVT Mode 1, or M1, is selected by applying clutch C1 70 only in order to "ground" the outer gear member of the third planetary gear set 28. The engine state can be one of ON ('M1_Eng_On') or OFF ('M1_Eng_Off'). A second continuously variable mode, i.e., EVT Mode 2, or M2, is selected by applying clutch C2 62 only to connect the shaft 60 to the carrier of the third planetary gear set 28. The engine state can be one of ON ('M2_Eng_On') or OFF ('M2_Eng_Off'). For purposes of this description, when the engine state is OFF, the engine input speed is equal to zero revolutions per minute ('RPM'), i.e., the engine crankshaft is not rotating. A fixed gear operation provides a fixed ratio operation of input-to-output speed of the transmission 10, i.e., $N_I/N_O$. A first fixed gear operation ('G1') is selected by applying clutches C1 70 and C4 75. A second fixed gear operation ('G2') is selected by applying clutches C1 70 and C2 62. A third fixed gear operation ('G3') is selected by applying clutches C2 62 and C4 75. A fourth fixed gear operation ('G4') is selected by applying clutches C2 62 and C3 73. The fixed ratio operation of inputto-output speed increases with increased fixed gear operation due to decreased gear ratios in the planetary gears 24, 26, and 28. The rotational speeds of the first and second electric machines 56 and 72, $N_A$ and $N_B$ respectively, are dependent on internal rotation of the mechanism as defined by the clutching and are proportional to the input speed measured at the input shaft 12.

In response to operator input via the accelerator pedal 113 and brake pedal 112 as captured by the user interface 13, the HCP 5 and one or more of the other control modules determine torque commands to control the torque generative devices comprising the engine 14 and first and second electric machines 56 and 72 to meet the operator torque request at the output member 64 and transferred to the driveline 90. Based upon input signals from the user interface 13 and the hybrid powertrain including the ESD 74, the HCP 5 determines the operator torque request, a commanded output torque from the transmission 10 to the driveline 90, an input torque from the engine 14, clutch torques for the torque-transfer clutches C1 70, C2 62, C3 73, C4 75 of the transmission 10; and the motor torques for the first and second electric machines 56 and 72, respectively, as is described hereinbelow.

Final vehicle acceleration can be affected by other factors including, e.g., road load, road grade, and vehicle mass. The operating range state is determined for the transmission 10 based upon a variety of operating characteristics of the hybrid powertrain. This includes the operator torque request communicated through the accelerator pedal 113 and brake pedal 112 to the user interface 13 as previously described. The operating range state may be predicated on a hybrid powertrain torque demand caused by a command to operate the first and second electric machines 56 and 72 in an electrical energy generating mode or in a torque generating mode. The operating range state can be determined by an optimization algorithm or routine which determines optimum system efficiency based upon operator demand for power, ESD state-of-charge, and energy efficiencies of the engine 14 and the first and second electric machines 56 and 72. The control system manages torque inputs from the engine 14 and the first and second electric machines 56 and 72 based upon an outcome of the executed optimization routine, and system efficiencies are optimized thereby, to manage fuel economy and ESD charging. Furthermore, operation can be determined based upon a fault in a component or system. The HCP 5 monitors the torque-generative devices, and determines the power output from the transmission 10 required in response to the desired output torque at output member 64 to meet the operator torque request. As should be apparent from the description above, the ESD 74 and the first and second electric machines 56 and 72 are electrically-operatively coupled for power flow therebetween. Furthermore, the engine 14, the first and second electric machines 56 and 72, and the electromechanical transmission 10 are mechanically-operatively coupled to transfer power therebetween to generate a power flow to the output member 64.

Figure 3:
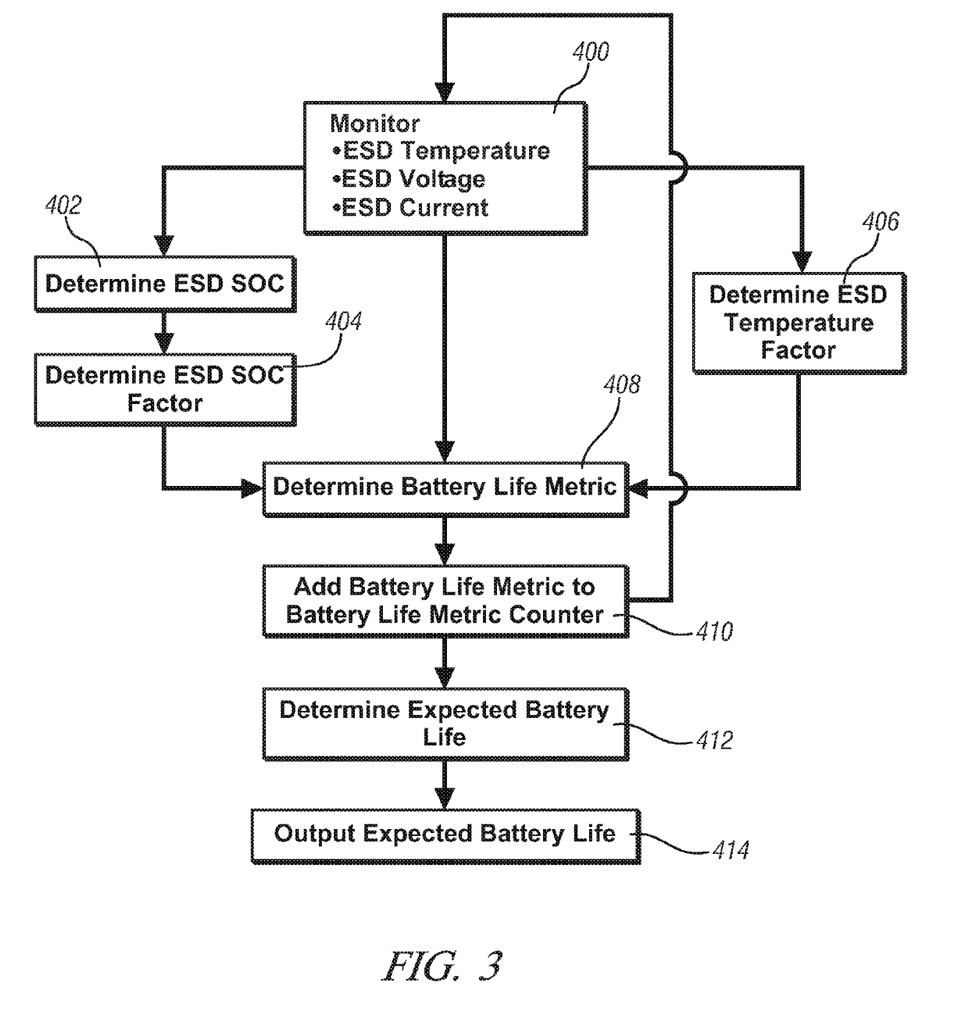
FIG. 3 is a flow chart illustrating the method for estimating an remaining battery life, in accordance with the present disclosure.

FIG. 3 shows a control flowchart for determining a battery life metric described hereinbelow with reference to the exemplary hybrid powertrain system shown in FIGS. 1 and 2, and residing in the aforementioned control modules in the form of executable algorithms and calibrations. The BPCM 21 monitors operating parameters of the ESD 74 including electrical current, open circuit voltage, and temperature (400). The BPCM 21 determines an estimated ESD state-of-charge (402). The HCP 5 determines an ESD state-of-charge factor (404), and an ESD temperature factor (406) based upon the monitored electrical current and voltage parameters and the battery temperature. The operating parameters may be monitored at predetermined time intervals that are based upon loop cycles or multiples of the loop cycles in the HCP 5, e.g., 100 milliseconds. The monitored operating parameters are determined for each of a plurality of successive time intervals to determine a total battery life metric during operation of the powertrain system. Temperature of the ESD 74 can be measured at any time during the time interval. Monitoring the electric current of the ESD 74 preferably comprises measuring and integrating, as a function of elapsed time, a magnitude of electrical current $I_{BAT}$ during each discharging event. The battery life metric measures and accounts for electrical current that discharging from the ESD 74. The battery life metric does not account for electrical current that charges the battery. The electrical current is measured using an electrical current monitoring device (not shown) from which it can determine an electric charge, in ampere-hours (A-h). A cumulative quantity of electrical energy passing through the ESD 74 is measured. The electrical current for any interval of time can then be determined by subtracting the cumulative quantity of electrical energy at a first instant in time from the cumulative quantity of electrical energy at a second instant in time.

The ESD state-of-charge (402) can be determined using one of several executable algorithmic methods. One exemplary method infers the state-of-charge from monitoring open circuit voltage. In one embodiment, a precalibrated lookup table can contain voltage measurements and corresponding state-of-charges. When the open circuit voltage is measured a corresponding state-of-charge can be determined from the lookup table. A second exemplary method utilizes a fully recursive least-squares analysis to estimate the state-of-charge. Another method estimates battery hysteresis to estimate state-of-charge. The ESD state-of-charge is determined for each time interval.

Figure 4:
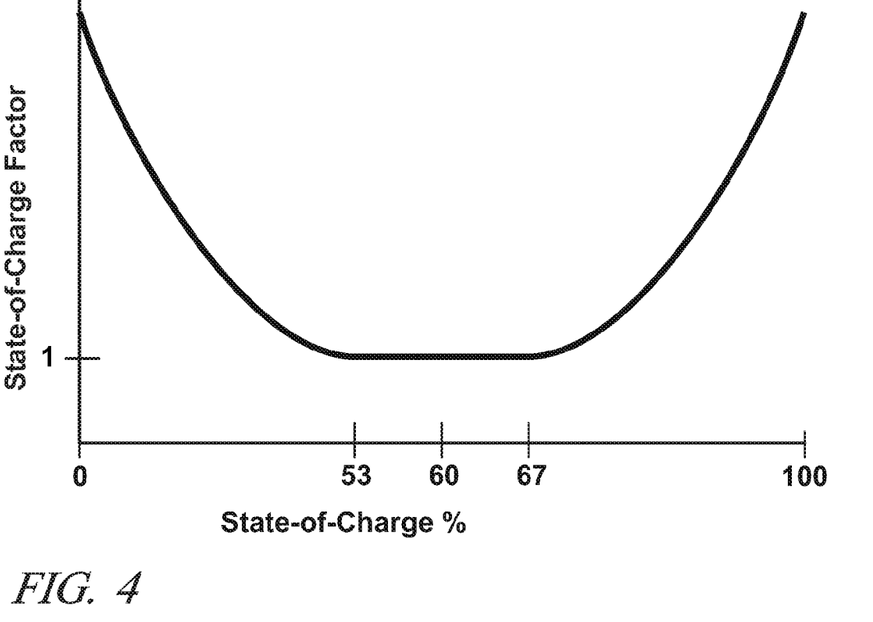
FIG. 4 graphically illustrates an exemplary state-of-charge factor graph, in accordance with the present disclosure.

The ESD state-of-charge factor can be determined based upon a variation of the state-of-charge from a nominal state-of-charge for the time interval (404). FIG. 4 shows a state-of-charge factor graph for the ESD 74 comprising an exemplary nickel-metal hydride (NiMH) battery. Other battery types including lithium-ion batteries may be used as the ESD 74 and may require different state-of-charge factor graphs. The state-of-charge factor graph takes into account effects of state-of-charge variations from the nominal state-of-charge on long term battery performance. In the exemplary state-of-charge factor graph for the NiMH battery a 60% state-of-charge is predetermined as a midpoint state-of-charge based upon self discharge rates and long term battery performance experiments and is, in the present embodiment, designated as the nominal state-of-charge. For the exemplary NiMH battery device, long term battery performance is minimally affected by charge/discharge swings of ±7% from nominal state-of-charge in the state-of-charge factor graph. As the state-of-charge varies from the nominal state-of-charge, long term battery performance can be affected and an increased ESD state-of-charge factor can be assigned. The variation of the state-of-charge from the nominal state-of-charge can comprise a maximum state-of-charge during the time interval. Alternatively, the variation of the state-of-charge from the nominal state-of-charge can comprise an average state-of-charge or a weighted average state-of-charge during the time interval.

Figure 5:
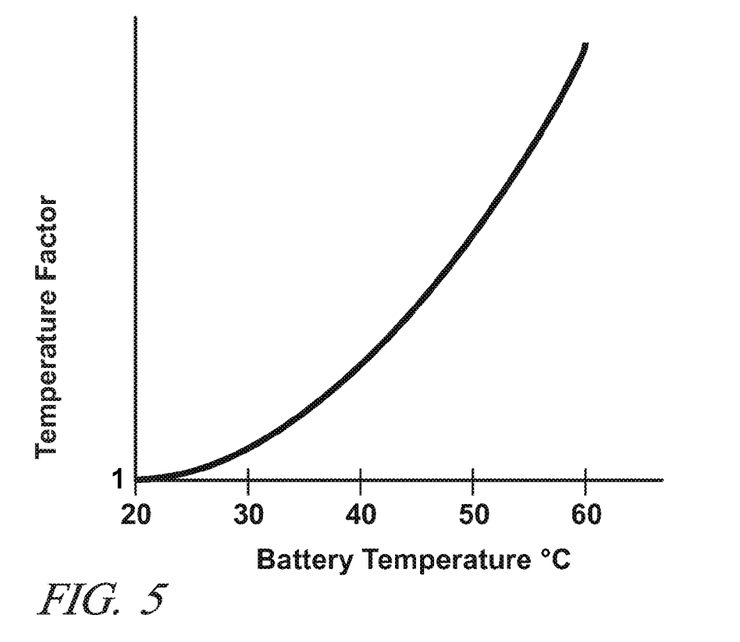
FIG. 5 graphically illustrates an exemplary temperature factor graph, in accordance with the present disclosure.

The ESD temperature factor is determined based upon a variation of the ESD temperature from a nominal temperature for the time interval (406). During each time interval, the HCP 5 monitors and determines a temperature of the ESD 74, preferably by monitoring signal output from one or more temperature sensing devices (not shown) operative to monitor the ESD 74. The ESD temperature can be determined based upon a temperature measurement at an instant in time during the time interval. Alternatively, the ESD temperature can be determined based upon an average ESD temperature over the time interval. The ESD temperature factor can be determined based upon the ESD temperature using an ESD temperature factor graph. FIG. 5 shows an ESD temperature factor graph for an exemplary NiMH battery. As the temperature of the ESD 74 increases during discharging, long term battery life is increasingly adversely affected per discharge unit over time, above a nominal temperature which is substantially 20° C. in this embodiment. The ESD temperature factor increases with increasing ESD temperature above 20° C.

A battery life metric can be determined based upon the ESD state-of-charge factor, the temperature factor, and the electrical current discharge for the time interval (408). The battery life metric is a weighted measure of electrical current discharge, preferably in ampere-hours, used over the time interval. In one embodiment, the battery life metric is determined by multiplying the ESD state-of-charge factor, the ESD temperature factor and the electrical current discharge for the time interval, and represents a weighted measurement of electrical current discharge usage of the ESD 74. The battery life metric accounts for the increased wear on battery life from use in higher temperature conditions and from greater variations in state-of-charge. The battery life metric is determined for each time interval during powertrain operation.

After the battery life metric is determined for the time interval it is added into a battery life metric counter (410). The battery life metric counter cumulatively monitors the total battery life metric by summing successively calculated battery life metrics over the life of the ESD 74. The battery life metric counter represents the total weighted electric current discharge, in ampere-hours, used over the life of the ESD 74.

The battery life metric counter can be used to determine a remaining operating life of the ESD 74 (412). The remaining operating life of the ESD 74 is preferably expressed in weighted ampere-hours. The battery life metric may also be used to determine when to replace the ESD 74. The battery life metric counter may be compared with a predetermined ESD lifespan or compared to a predicted vehicle fleet ESD lifespan. Both the predetermined ESD lifespan and the predicted vehicle fleet ESD lifespan may be expressed in ampere-hours. Once the remaining life expectancy of the ESD 74 and the remaining weighted ampere-hours left on the ESD 74 are determined, the HCP 5 may output the data to the operator (414).

The predicted vehicle fleet ESD lifespan can be determined based upon vehicle fleet data accumulated from a plurality of similar vehicles. The vehicle fleet data preferably includes the battery life metric counter, ohmic resistance on the ESD 74, voltage drop conditions for each of the similar vehicles, and other conditions. The data may be accumulated by a wireless data acquisition system including a central database and a communications system. One such commercially available system is the OnStar™ system, or by data downloads at service stations. Once the fleet data is accumulated, statistical information may be determined including a mean ESD lifespan for the fleet. The predicted vehicle fleet ESD lifespan can be the mean ESD lifespan or a lifespan at a predetermined standard deviation from the mean, or other statistically significant evaluations of the ESD lifespan.

An adapted predicted vehicle fleet lifespan may also be based upon the fleet data. The fleet data used to determine the adapted predicted vehicle fleet lifespan may be continuously updated to include the statistical information. The fleet data may be plotted against the ohmic resistance and voltage drop conditions to determine different predated lifespans.

It is understood that modifications are allowable within the scope of the disclosure. The disclosure has been described with specific reference to the preferred embodiments and modifications thereto. Further modifications and alterations may occur to others upon reading and understanding the specification. It is intended to include all such modifications and alterations insofar as they come within the scope of the disclosure.

The invention claimed is:

1. A method for estimating a remaining operating life of an electrical energy storage device electrically operatively connected to an electric machine of a hybrid powertrain system, comprising:
    monitoring temperature, state-of-charge, and electric current during both charging and discharge events of the electrical energy storage device during a predetermined time interval;
    determining an electric current discharge comprising integrating the electric current during the discharge events of the electrical energy storage device during the predetermined time interval;
    determining a temperature factor and a state-of-charge factor based upon the monitored temperature and the monitored state-of-charge during the predetermined time interval;
    calculating a battery life metric during the predetermined time interval based upon the temperature factor, the state-of-charge factor, and the electric current discharge, wherein the battery life metric accounts for the electric current discharge during the predetermined time interval and does not account for the electric current during the charging of the electrical energy storage device during the predetermined time interval;
    determining a total battery life metric based on the calculated battery life metric; and
    determining the remaining operating life of the electrical energy storage device based upon the total battery life metric.

2. The method of claim 1, wherein the temperature factor is determined from a predetermined function based upon temperature of the electrical energy storage device at any instant of time within the predetermined time interval.

3. The method of claim 2, wherein the predetermined function comprises temperature factor increases with increasing temperature of the electrical energy storage device.

4. The method of claim 1, wherein the state-of-charge factor is determined from a predetermined function based upon the state-of-charge of the electrical energy storage device at any instant of time within the predetermined time interval.

5. The method of claim 4, wherein the predetermined function comprises a unity state-of-charge factor for states-of charge within a preferred state-of-charge range, increasing state-of-charge factor with increasing state-of-charge greater than the preferred state-of-charge range, and increasing state-of-charge factor with decreasing state-of-charge less than the preferred state-of-charge range.

6. The method of claim 1, wherein calculating the battery life metric during the predetermined time interval based upon the temperature factor, the state-of-charge factor, and the integrated electric current comprises calculating the battery life metric as product of the electric current discharge, the temperature factor, and the state-of-charge factor.

7. The method of claim 1, wherein determining the remaining operating life of the electrical energy storage device based upon the total battery life metric comprises comparing the total battery life metric with a predetermined battery lifespan.

8. The method of claim 1, wherein determining the remaining operating life of the electrical energy storage device based upon the total battery life metric comprises comparing the total battery life metric with a predicted electrical energy storage device lifespan based upon collected vehicle fleet data.

9. The method of claim 8, wherein the predicted electrical energy storage device lifespan comprises a lifespan at a predetermined standard deviation from a mean electrical energy storage device lifespan determined from the collected vehicle fleet data.

10. The method of claim 1, wherein determining the total battery life metric comprises cumulatively summing successively calculated battery life metrics.

11. A method for estimating a remaining operating life of an electrical energy storage device electrically connected to transmit power to an electro-mechanical transmission, comprising:
- monitoring temperature of the electrical energy storage device;
- monitoring a state-of-charge during both charging and discharge events of the electrical energy storage device during a predetermined time interval;
- monitoring electric current of the electrical energy storage device during the predetermined time interval;
- determining an electric current discharge comprising integrating the electric current during the discharge events of the electrical energy storage device during the predetermined time interval;
- determining a temperature factor and a state-of-charge factor based upon the monitored temperature and the monitored state-of-charge during the predetermined time interval;
- calculating a battery life metric during the predetermined time interval based upon the temperature factor, the state-of-charge factor, and the electric current discharge, wherein the battery life metric accounts for the electric current discharge during the predetermined time interval and does not account for the electric current during the charging of the electrical energy storage device during the predetermined time interval;
- determining a total battery life metric based on the calculated battery life metric; and
- determining the remaining operating life of the electrical energy storage device based upon a predicted electrical energy storage device lifespan and the total battery life metric, wherein the remaining electrical energy storage device life is the difference between the predicted battery lifespan and the total battery life metric.

12. The method of claim 11, wherein said predicted electrical energy storage device lifespan is based upon collected vehicle fleet data, wherein the predicted electrical energy storage device lifespan is a lifespan at a predetermined standard deviation from a mean electrical energy storage device lifespan determined from the collected vehicle fleet data.

13. The method of claim 11, wherein determining the total battery life metric comprises cumulatively summing successively calculated battery life metrics.

* * * * *